(12) United States Patent
Wenger

(10) Patent No.: US 9,028,133 B2
(45) Date of Patent: May 12, 2015

(54) TAPERED BARREL TWIN SHAFT PRECONDITIONER

(71) Applicant: Wenger Manufacturing, Inc., Sabetha, KS (US)

(72) Inventor: Marc L. Wenger, Sabetha, KS (US)

(73) Assignee: Wenger Manufacturing, Inc., Sabetha, KS (US)

( * ) Notice: Subject to any disclaimer, the term of this patent is extended or adjusted under 35 U.S.C. 154(b) by 0 days.

(21) Appl. No.: 14/198,859

(22) Filed: Mar. 6, 2014

(65) Prior Publication Data

US 2015/0020695 A1 Jan. 22, 2015

Related U.S. Application Data

(60) Provisional application No. 61/810,041, filed on Apr. 9, 2013.

(51) Int. Cl.
| | |
|---|---|
| *B01F 7/04* | (2006.01) |
| *B01F 7/08* | (2006.01) |
| *H01L 21/768* | (2006.01) |
| *A47J 36/00* | (2006.01) |

(52) U.S. Cl.
CPC .......... *B01F 7/081* (2013.01); *H01L 21/76877* (2013.01); *A47J 36/00* (2013.01); *B01F 7/042* (2013.01); *B01F 2215/0014* (2013.01)

(58) Field of Classification Search
CPC .... B01F 7/00258; B01F 7/04; B01F 7/00125; B01F 7/021; B01F 7/042; B01F 7/047
USPC ............. 366/66, 91, 96–99, 172.2, 290–291, 366/297–301, 323, 325.2, 326.1, 366/327.1–327.3, 329.2, 83, 89, 292; 426/519

See application file for complete search history.

(56) References Cited

U.S. PATENT DOCUMENTS

| | | | | |
|---|---|---|---|---|
| 1,411,103 | A | * | 3/1922 | Hughes ........................... 366/97 |
| 1,767,102 | A | * | 6/1930 | Thorne ......................... 366/297 |
| 3,334,873 | A | * | 8/1967 | Stickelber ...................... 366/91 |
| 3,605,188 | A | * | 9/1971 | McCormick et al. .......... 425/205 |
| 4,752,139 | A | * | 6/1988 | Hauck ........................... 366/298 |
| 5,087,864 | A | * | 2/1992 | Abel ............................... 318/34 |
| 5,161,888 | A | * | 11/1992 | Hauck ........................... 366/299 |
| 5,460,448 | A | * | 10/1995 | Woolsey ........................ 366/301 |
| 6,109,779 | A | * | 8/2000 | Weinekotter et al. ......... 366/193 |
| 6,247,394 | B1 | * | 6/2001 | Huber et al. .................... 99/352 |
| 6,340,487 | B1 | * | 1/2002 | Wenger et al. ................ 426/231 |
| 6,387,429 | B1 | * | 5/2002 | Huber et al. ................... 426/516 |
| 6,465,029 | B2 | * | 10/2002 | Wenger et al. ................ 426/231 |
| 6,482,453 | B2 | * | 11/2002 | Wenger et al. ................ 426/231 |
| 7,883,263 | B1 | * | 2/2011 | Wenger et al. ............. 366/172.2 |
| 7,906,166 | B2 | * | 3/2011 | Wenger et al. ................ 426/461 |
| 7,963,214 | B1 | * | 6/2011 | Wenger et al. .................. 99/348 |

(Continued)

*Primary Examiner* — Charles Cooley
(74) *Attorney, Agent, or Firm* — Hovey Williams LLP

(57) ABSTRACT

An improved dual-shaft preconditioner (10) of simplified design is provided giving increased moisturization and partial cooking of food or feed ingredients. The preconditioner (10) includes an elongated, tapered housing (12) presenting a pair of side-by-side, communicating housing sections (58, 60), with a corresponding pair of converging shafts (20, 22) within the sections (58, 60) and having a series of elongated, outwardly extending mixing elements (24, 26) secured to the shafts (20, 22). The preconditioner (10) is designed for use in a system including a downstream processing device, such as an extruder (146).

14 Claims, 4 Drawing Sheets

(56) References Cited

U.S. PATENT DOCUMENTS

| | | | |
|---|---|---|---|
| 8,177,414 B1* | 5/2012 | Wenger | 366/155.2 |
| 8,858,065 B1* | 10/2014 | VanDalsem et al. | 366/158.5 |
| 2003/0112698 A1* | 6/2003 | Hauck et al. | 366/85 |
| 2008/0094939 A1* | 4/2008 | Wenger et al. | 366/301 |
| 2008/0095910 A1* | 4/2008 | Wenger et al. | 426/557 |
| 2009/0067282 A1* | 3/2009 | Wenger et al. | 366/300 |
| 2009/0175119 A1* | 7/2009 | Wenger | 366/132 |
| 2011/0262609 A1* | 10/2011 | Wenger et al. | 426/513 |
| 2012/0052174 A1* | 3/2012 | Wenger et al. | 426/510 |

* cited by examiner

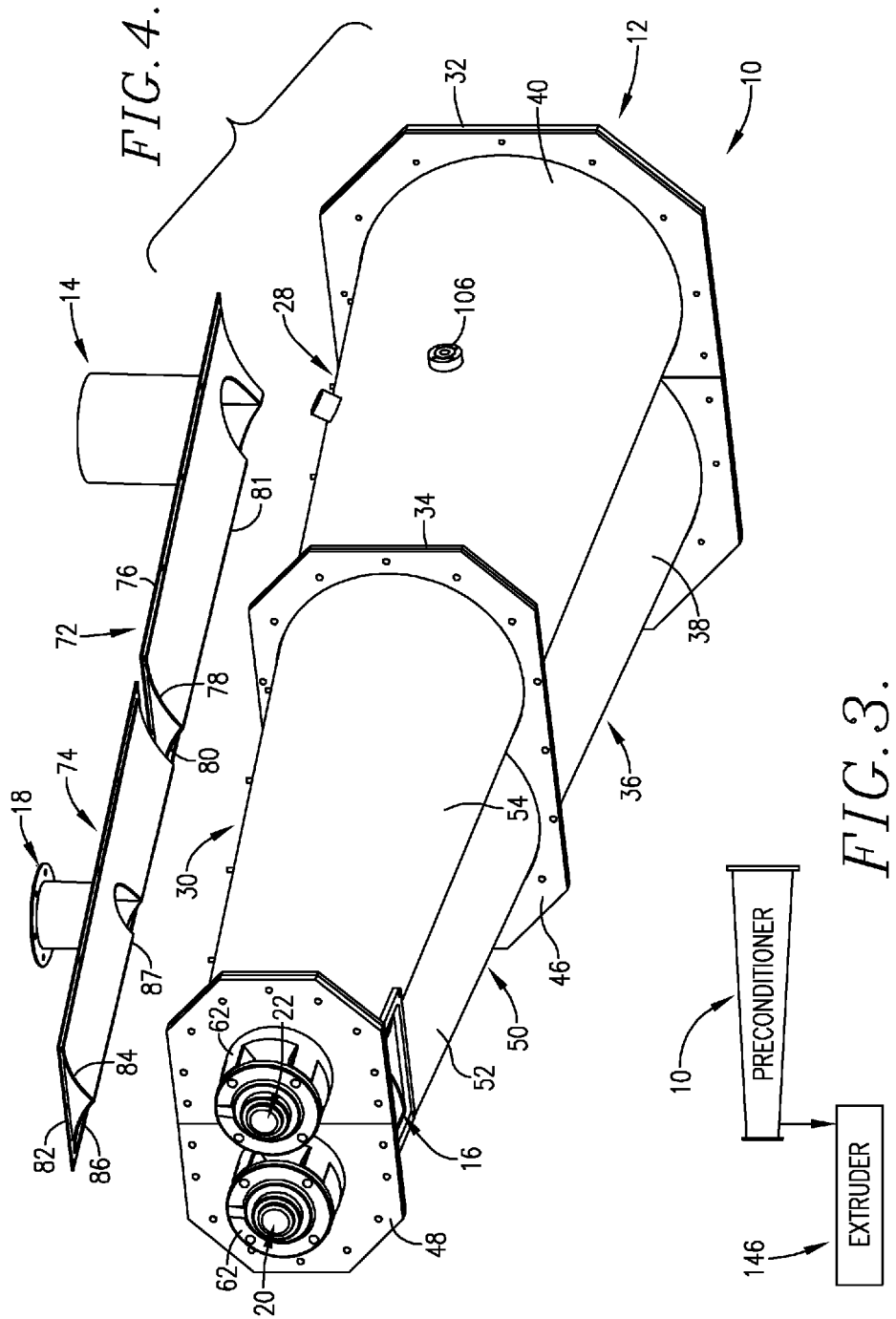

TAPERED BARREL TWIN SHAFT PRECONDITIONER

CROSS-RELATED APPLICATIONS

This is a non-provisional application that claims the benefit of U.S. Patent Application Ser. No. 61/810,041 filed Apr. 9, 2013, which is incorporated herein by reference in its entirety.

BACKGROUND OF THE INVENTION

1. Field of the Invention

The present invention is broadly concerned with improved, tapered barrel twin shaft preconditioners, which are of economical design while nonetheless providing substantial preconditioning of animal feed or human food materials in order to moisturize and partially cook such materials prior to downstream processing, e.g., extrusion or pelleting. More particularly, the invention is concerned with such preconditioners having an elongated tapered barrel presenting side-by-side communicating chambers with elongated, axially rotatable, non-parallel, relatively converging shafts within the chambers and having a plurality of outwardly extending mixing elements or beaters thereon.

2. Description of the Prior Art

The majority of feed production systems include a preconditioner serving to moisturize and sometimes partially cook the starting feed ingredients (e.g., respective quantities of protein, fat, and starch such as would be found in pet food ingredients). Such preconditioners are mated with downstream processing devices, such as pellet mills or extruders. Generally, preconditioners of this type are provided with injection ports along the length of the housings for injection of steam and/or water during processing. The combination of energy (both thermal and mechanical) may serve to partially gelatinize the material passing through the preconditioner, measured as the extent of gelatinization of the starch content, but in any event provides needed moisture for facilitating downstream processing.

The preconditioner art has evolved over a long period of time. One early type of preconditioner, known as a Wenger DC preconditioner, had a pair of side-by-side chambers of equal cross-sectional area with a corresponding shaft within each chamber, and equipped with a plurality of outwardly extending, blade-like beater elements. These types of preconditioners were capable of gelatinizing the starting ingredients to a level of perhaps 20%.

A significant improvement in preconditioners is exemplified in U.S. Pat. No. 4,752,139. These preconditioners, known as Wenger DDCs, had a housing likewise presenting side-by-side chambers, but with one chamber being of greater cross-sectional area than the other. Furthermore, the shafts were operated at different rotational speeds. These types of DDC units were capable of achieving something on the order of 30% gelatinization of the starting materials.

A more recent improvement is found in U.S. Pat. No. 7,674,492. These preconditioners were similar to the DDC models, but each shaft was equipped with a variable speed drive allowing the respective shafts to be adjusted, both in terms of rotational speed and direction of rotation, during operation of the preconditioner. This latest generation of preconditioners is commercialized by Wenger as HIP preconditioners, and these are capable of achieving 50-60% gelatinization.

An alternate approach to preconditioning apparatus is illustrated in U.S. Pat. No. 7,883,263, which discloses a single shaft preconditioner of tapered design, i.e., the housing tapers at a constant angle from the larger input end to the smaller output end. The rotatable shaft carries a number of outwardly extending beaters which are of decreasing height along the length of the housing so as to conform with the taper thereof. This preconditioner is specifically designed for less expensive, relatively low capacity extrusion or pelleting systems, but nevertheless provides a high degree of moisturization and precooking of the food or feed ingredients.

Additional prior art references include U.S. Pat. Nos. 617,983, 2,831,663, 4,775,239, 5,161,888, 5,232,280, 5,460,448, 6,129,010, 6,609,819, 6,648,501, and 7,322,738, and Japanese references JP 06055050 and JP 63151341.

SUMMARY OF THE INVENTION

The present invention provides a novel preconditioner of simplified design, which achieves high levels of moisturization and cook values in food or feed materials being processed. Broadly speaking, the preconditioners of the invention include an elongated, tapered, converging-wall housing presenting an inlet and an opposed outlet, with the housing having a larger diameter end proximal to the inlet, a smaller diameter end proximal to the outlet, and a tapered wall section between the housing ends. The housing defines a pair of elongated, tapered and converging, side-by-side, communicating chambers preferably of substantially frusto-circular shape in cross-section.

A pair of elongated, axially rotatable, non-parallel, relatively converging shafts extend along the length of the housing chambers, with each shaft supporting a plurality of axially spaced apart, outwardly extending mixing elements. The mixing elements are relatively axially offset on the shaft in order to prevent interference between the mixing elements during rotation of the shafts, and the mixing elements of the shafts are in an intercalated relationship to promote intense mixing of materials being processed, and to prevent agglomeration of materials in the region between the housing chambers. The outboard ends of the mixing elements are preferably in close proximity to the inner surfaces of the housing chambers along the lengths of the latter, this distance preferably being up to about one-half inch.

BRIEF DESCRIPTION OF THE DRAWINGS

FIG. 3 is a schematic view illustrating the preconditioner of the present invention coupled with a downstream extruder;

FIG. 4 is a bottom perspective view of the preconditioner, illustrating the top cover sections in exploded relationship to the remainder of the preconditioner housing;

DETAILED DESCRIPTION OF THE PREFERRED EMBODIMENTS

Figure 1:
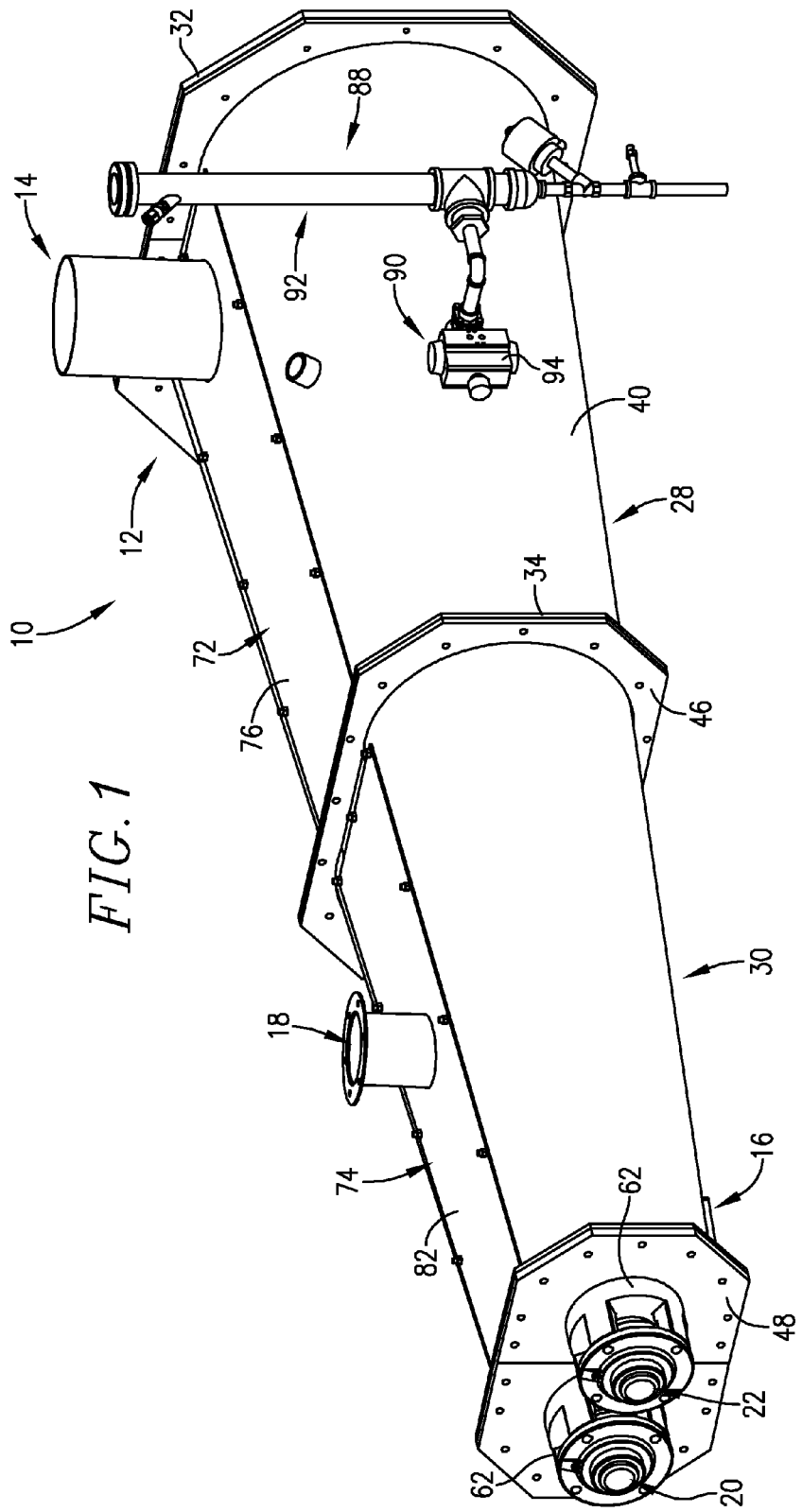
FIG. 1 is a perspective view of an improved dual-shaft preconditioner in accordance with the invention, illustrated with an optional improved steam/water injection assembly.
Figure 2:
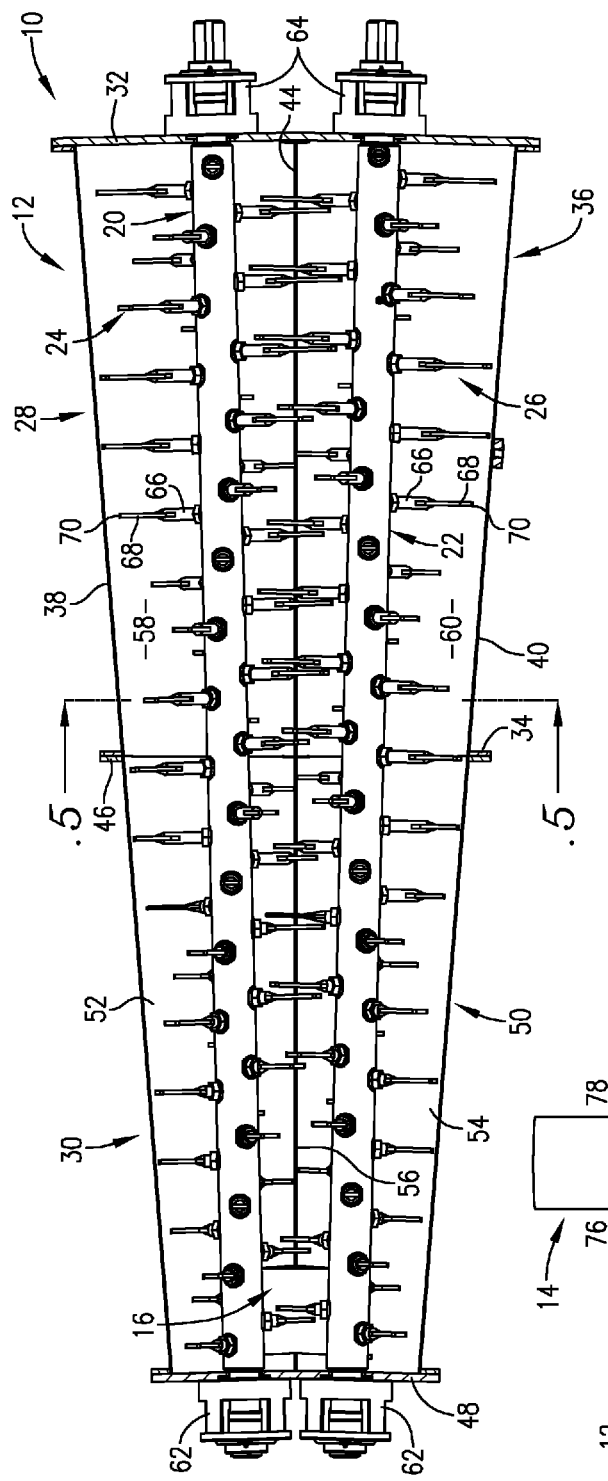
FIG. 2 is a top view of the preconditioner with the upper section of the preconditioner housing removed to illustrate the dual shaft/mixing elements internal constructions.

Referring to FIGS. 1-2 and 4-5, it will be seen that a preconditioner 10 is illustrated, which is designed for the moisturization or partial cooking of food or feed materials, which are later processed in a downstream device, such as an extruder or pellet mill. Broadly speaking, the preconditioner 10 includes an elongated, tapered housing 12 presenting an inlet 14, an outlet 16, and an intermediate vent 18 between the inlet and outlet. Internally, the preconditioner 10 has a pair of elongated, axially rotatable, converging shafts 20 and 22, each equipped with a series of outwardly extending mixing elements or beaters 24 and 26, which are of uniformly varying height along the length of each shaft; the mixing elements 24, 26 are relatively axially offset so as to permit rotation of the shafts without interference from the mixing elements.

Figure 5:
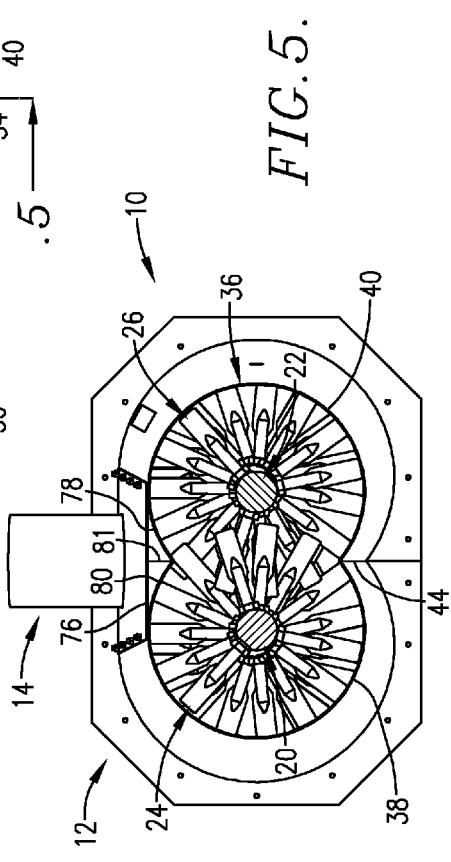
FIG. 5 is a vertical sectional view of the preconditioner, illustrating the intercalation of the shaft-mounted mixing elements, and the orientation of the housing walls relative to the outer ends of the mixing elements.

In more detail, the housing 12 comprises two elongated, tapered, end-to-end interconnected segments 28 and 30. Housing segment 28 includes an apertured rear wall 32 and a forward flange 34. An arcuate, tapered sidewall 36 extends between and is connected to the wall 32 and flange 34, and presents a pair of communicating arcuate sections 38 and 40, which are of frusto-circular configuration in cross-section (FIG. 5). In the illustrated embodiment, each arcuate wall section 38, 40 extends through an arc of approximately 260°. As illustrated, the upper ends of the wall sections 38, 40 are in close adjacency and cooperatively define an elongated, narrow slot (not shown), whereas the lower ends of the sections 38, 40 are welded together to form a joint 44.

In like manner, the housing segment 30 has a rear connection flange 46, an apertured front wall 48, and a tapered sidewall 50 extending between and interconnected to the flange 46 and wall 48. As in the case of segment 28, the sidewall 50 presents tapered communicating arcuate sections 52 and 54 extending through arcs of about 260°, with an elongated, narrow slot (not shown) between the upper ends of the sections 52, 54, and a lower, welded-together joint 56. The sections 52, 54 are also tapered between the flanges 46 and 48. The segments 28 and 30 are interconnected by appropriate connectors (not shown) through the mated flanges 34 and 46 so as to define a pair of elongated, continuous, uniformly tapered, arcuate sections generally referred to by the numerals 58 and 60, which converge at an angle of 3°. The lower joints 44 and 56 cooperatively define a welded joint extending the full length of housing 12. Similarly, the upper elongated slots (not shown) define an effectively continuous slot along the upper extent of housing 12.

The shafts 20 and 22 are centrally located within the sections 58 and 60 and are supported by front and rear bearings 62 and 64. Although not shown, appropriate gear reducer and motor apparatus is operatively coupled to the rearmost ends of the shafts in order to rotate the latter. In the illustrated design, the shafts are counter-rotating (i.e., the shafts rotate in opposite clockwise directions), but, if desired, the shafts could be co-rotating (i.e., in the same clockwise directions). The shafts are also located to converge at 3°, consistent with the configuration of the sections 58 and 60.

The mixing elements 24, 26 each include an inboard shank 66 connected to the corresponding shaft and an outwardly extending blade 68 terminating in an outermost margin 70. As depicted, the blades 68 are all oriented in a "neutral" position; however, if desired, the blades may be individually oriented in a "positive" position, serving to more rapidly move material from inlet 14 to outlet 16, or in a "negative" position, where the flow of material is retarded. Such blade orientations may be specifically selected to increase or decrease the residence time of materials passing through preconditioner 10.

The upper ends of housing segments 28 and 30 are provided with individual, separately attached cover assemblies 72 and 74, which close the aforementioned narrow slots. The assembly 72 includes a top plate 76 with a pair of arcuate, downwardly and inwardly extending walls 78, 80, which are interconnected at joint 81, and which mate with the upper sections of arcuate sections 38, 40. The inlet 14 is supported by cover 72 as illustrated. Similarly, the cover 74 has a top plate 82 and mating downwardly and inwardly extending arcuate walls 84, 86, terminating in joint 87. Thus, the joints 81 and 87 close the upper narrow slots and define an upper joint in opposition to previously described continuous lower joint. The vent 18 is supported on top wall 82, as depicted.

As best illustrated in FIGS. 1 and 5-8, the preconditioner 10 is equipped with an improved composite moisture injection assembly 88, which is secured to the arcuate section 40 of housing segment 28. The purpose of assembly 88 is to inject fluids such as water and/or steam into the housing 12 during the operation of preconditioner 10. In prior preconditioners, a series of ports have been provided along the length of the preconditioner housing for this purpose, with injectors and related plumbing being provided to supply moisture. However, the improved assembly 88 replaces much, if not all, of this prior injection structure, rendering the design more simple and less expensive.

Figure 7:
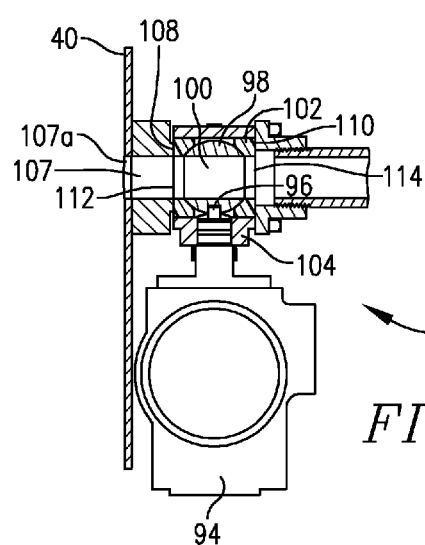
FIG. 7 is an elevational view of the preferred static mixer element used in the steam/water injection assembly.
Figure 6:
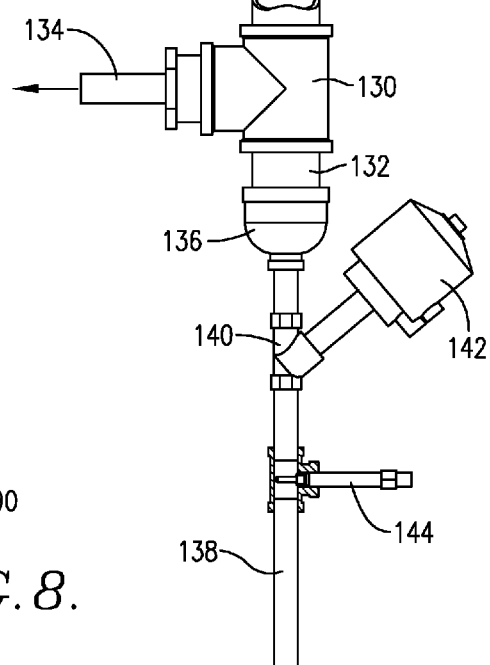
FIG. 6 is an elevational view with parts broken away of the improved steam/water injection assembly illustrated in FIG. 1.
Figure 8:
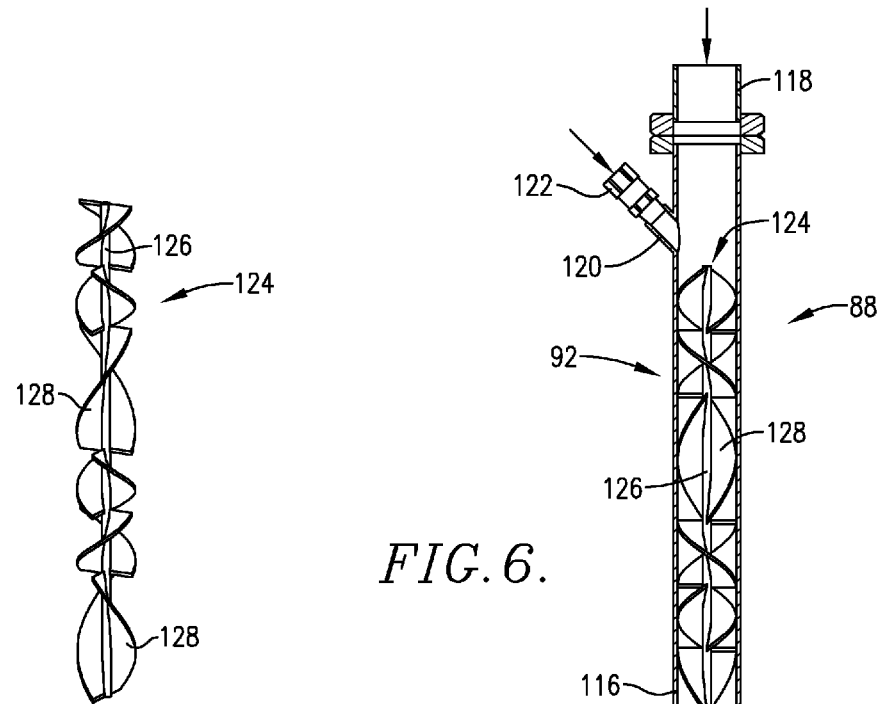
FIG. 8 is a sectional view illustrating the preferred ball valve used in the steam/water injection assembly of FIG. 6.

Turning to FIGS. 6-8, the composite assembly 88 is illustrated in detail, and broadly includes a fluid injection valve assembly 90 and a static mixing section 92. The assembly 88 is designed to inject a plurality of mixed fluids into preconditioner 10, such as steam/water or steam/water additives. As explained in greater detail below, the assembly 88 simplifies the equipment required for fluid injection, is more sanitary, increases the energy efficiency of the preconditioner, and results in higher levels of moisture and/or cook in the preconditioned products, as compared with conventional fluid injection equipment.

The injection valve assembly 90 (FIG. 8) includes a selectively actuatable valve body 94 having an internal mechanical drive (not shown) with an outwardly extending, axially rotatable stem 96. The stem 96 is connected to a spherical valve ball 98 having a central passageway 100. The ball 98 is located within a tubular segment 102, which is received within an outer valve sleeve 104. The inboard end of sleeve 104 is secured to mounting plate 106 affixed to wall section 40, the latter being apertured to allow passage of fluids into the confines of housing 12 through aperture 107 having an inner opening 107a. It will be observed that the central passageway 100 and the bore of segment 102 are of equal diameter, and that the opposed inboard and outboard faces 108, 110 of the segment 102 respectively define the fluid outlet 112 and fluid inlet 114 of the valve assembly 90. In preferred practice, the valve assembly 90 is an automated valve, which can be controlled as a part of an overall digital control system for the preconditioner 10. However, other types of valves may be used in this context.

The static mixing section 92 includes an upright tubular casing 116 with an uppermost tubular steam inlet 118 and an oblique water inlet 120, preferably equipped with an atomizer 122. A static mixer 124 is situated within casing 116 and includes an elongated, stationary central shaft 126 with a plurality of generally helical, outwardly extending plates 128 secured to the shaft 126. The function of mixer 124 is to intensely mix incoming streams of steam and water, and any other desired additives, for delivery to injection valve assembly 90. To this end, a pipe tee 130 is secured to the bottom end of casing 116, and the transverse leg thereof is operatively coupled to the inlet 114 of valve assembly 90 by means of conventional piping 132.

The lower end of tee 130 is equipped with a pipe section 134, reducer 136, and condensate outlet pipe 138. The pipe 138 has an intermediate valve 140, which is controlled by solenoid 142. A resistance temperature probe 144 is operatively coupled with pipe 138 below valve 140, and serves to measure the steam condensate temperature and monitor the presence of live steam prior to start-up of he system; once the temperature reaches 100° C., the valve 94 closes and the system can start. Of course, the probe 144 and solenoid 142 are connected to the overall digital control system for the preconditioner 10 for automated control of valve 140.

An important aspect of the invention is the geometry of the injection valve assembly 90 and the injection aperture 107. In order to substantially reduce or even eliminate the possibility of plugging of the valve assembly 90, the diameters of the injection aperture 107, injection opening 107a, valve ball passage 100, the bore of segment 102, the valve inlet 114, and the valve outlet 112 should all be at least about 1 inch, and more preferably from about 1-2 inches, and are advantageously all the same diameter. Furthermore, the axial distance between the fluid outlet 112 and the opening 107a should be held to a minimum. This distance should be no more than about 3 inches, preferably less than about 2 inches, still more preferably less than about 1 inch, and most preferably less than about one-half inch.

In operation, food or feed materials are passed into housing 12 via inlet 14, the shafts 20, 22 are axially rotated, and water and/or steam and/or additives are injected into the barrel by injection assembly 88. The rotation of the shafts 22, 22 serves to intimately mix the food or feed ingredients and the injected liquids, and to propel the mixture towards and through outlet 116. As such mixing proceeds, the mixing elements 24, 26 intercalate throughout substantially all of the approximately 100° open arcs between the frusto-circular sections 58 and 60, and essentially throughout the entirety of the length of housing 12. This intercalation can best be understood through a consideration of FIGS. 2 and 5. The convergence of the sections 58 and 60 between rear wall 32 and front wall 48 greatly assists in the uniform moisturization and partial cooking of the food or feed ingredients. That is, owing to the fact that the internal volume of the preconditioner decreases along its length, the food or feed materials are compressed during passage through the preconditioner 10 so that any extraneous steam present within the housing 12 is more effectively absorbed by the food or feed ingredients. Of course, the rotation of the shafts 20, 22 and the consequent intense mixing of the liquid and solid materials, augment these effects.

The preconditioner of the invention is operable to moisturize typical food or feed ingredients to a level of at least about 18% by weight, wet basis, and more preferably to a level of 20-40% by weight, wet basis. The residence time of the materials passing through preconditioner 10 usually vary from about 0.6-4 minutes, more preferably from about 1-3 minutes. The preconditioner is not designed as a pressurized vessel, and during operation the internal pressure is atmospheric or slightly above atmospheric.

While the preferred embodiment is designed to present a three-degree taper of the housing sections 58 and 60 and shafts 20, 22, the invention is not so limited. More generally, these convergent angles should range from about 2-9°. Further, while the use of the injection assembly 88 is preferred, conventional steam/water injectors may be used in lieu thereof. Additionally, while in preferred forms the housing sections 58, 60 extend through an arc of approximately 260°, this may be varied so that the arc may range between about 180° and 300°. Finally, while in the preferred design the housing sections 58 and 60 are of substantially the same size along the length of the housing 12, if desired, one of the sections could have a larger diameter as compared with the adjacent section; in such an embodiment, the length of the corresponding mixing elements 24, 26 would be matched with the different sizes of the sections.

As indicated above, the preconditioner 10 is usually mated with a downstream processing device, and especially an extruder 146 (see FIG. 3). The extruder 146 is itself conventional and generally has an elongated, tubular barrel with an inlet and a restricted orifice die outlet. Internally, the extruder is equipped with one or more elongated, axially rotatable, helically flighted extrusion screws, which serve to subject preconditioned materials to elevated levels of temperature, pressure, and shear, in order to fully cook and form the final food or feed product. In alternate arrangements, a pellet mill (not shown) may be used instead of an extruder.

The dual shaft preconditioner of the present invention provides significant operational advantages, as compared with the single shaft preconditioner disclosed in U.S. Pat. No. 7,883,263. For example, the present invention gives superior mixing as compared with the single chamber design. During processing, both dispersive mixing and increased distributed mixing is obtained in the present invention. Moreover, the dual chamber design hereof also allows greater volumes and through-puts using the same lengths of housing and shafts. If an attempt were made to increase the capacity of the single shaft design of the '263 patent by extending the lengths of the housing and shaft, there would be a greater potential for broken shafts or other mechanical failures. Finally, the greater mixing intensity achieved in the present invention translates to more uniform hydration and cook in the material being processed.

I claim:

1. A dual-shaft preconditioner operable to moisturize and partially cook feed or food materials prior to downstream processing thereof, said preconditioner comprising:

an elongated housing presenting an inlet and an opposed outlet, said housing having a larger end proximal to said inlet and a smaller end proximal to said outlet, and a tapered wall section between said housing ends, said tapered wall section presenting a pair of elongated, juxtaposed, intercommunicating arcuate sections each tapered along the length thereof, said arcuate sections terminating at respective upper and lower elongated joints; and a pair of elongated, axially rotatable, non-parallel, converging shafts respectively extending along the length of a corresponding arcuate section, and each having a plurality of axially spaced apart, outwardly extending mixing elements, the mixing elements being spaced apart along the length of each shaft and axially offset in order to prevent interference between the mixing elements during rotation of said shafts, said mixing elements each having an elongated shank extending outwardly from said axially rotatable shafts, said mixing elements being of progressively different lengths respectively between the associated shafts and the outer margins of the mixing elements remote from the shafts, with the longest of said mixing elements being proximal to said inlet, said mixing elements of said shafts intercalating during rotation thereof between said upper and lower joints, the outer margins of said mixing elements of each shaft being spaced from the inner surface of each corresponding arcuate section during said shaft rotation a short distance to facilitate movement of feed or food materials through said housing, said outer margins cooperatively defining a taper along the length of each corresponding arcuate section.

2. The preconditioner of claim 1, each of said wall sections being progressively tapered along the length thereof at an angle of from about 2-9°.

3. The preconditioner of claim 1, said shafts converging towards each other at an angle of from about 2-9°.

4. The preconditioner of claim 1, said wall sections and said shafts converging at the same angle.

5. The preconditioner of claim 1, said preconditioner operable to moisturize said feed materials to a moisture level of at least about 18% by weight, wet basis.

6. The preconditioner of claim 1, said preconditioner operable to retain said feed material for a time of from about 0.6-4 minutes.

7. The preconditioner of claim 1, said housing and shaft operable to moisturize said feed material at substantially atmospheric pressure within said housing and across said outlet.

8. The preconditioner of claim 1, said mixing elements each having an outwardly extending blade having a width greater than the width of said shank.

9. The preconditioner of claim 1, said distance being no more than about one-half inch.

10. The preconditioner of claim 1, said arcuate sections each being substantially frusto-circular in cross-section and extending through an arc of from about 180-300°.

11. The preconditioner of claim 10, said arc being about 260°.

12. The preconditioner of claim 1, each of said arcuate sections being of the same size along the length of said housing.

13. A processing system comprising a preconditioner in accordance with claim 1, together with a downstream processing device, the outlet of said housing operably coupled with the inlet of said processing device.

14. The system of claim 13, said downstream processing device being an extruder.

* * * * *